(12) United States Patent
Rao et al.

(10) Patent No.: US 10,742,220 B1
(45) Date of Patent: Aug. 11, 2020

(54) METHOD AND APPARATUS FOR OPERATING PROGRAMMABLE CLOCK DIVIDER USING RESET PATHS

(71) Applicant: Synopsys, Inc., Mountain View, CA (US)

(72) Inventors: Venkata N. S. N. Rao, Fremont, CA (US); Majid Jalali Far, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/398,644

(22) Filed: Apr. 30, 2019

(51) Int. Cl.
*H03K 23/66* (2006.01)
*H03K 21/38* (2006.01)
*H03K 21/02* (2006.01)

(52) U.S. Cl.
CPC ........... *H03K 23/66* (2013.01); *H03K 21/026* (2013.01); *H03K 21/38* (2013.01)

(58) Field of Classification Search
USPC .................................. 327/113–115, 117, 118
See application file for complete search history.

(56) References Cited

U.S. PATENT DOCUMENTS

| | | | | |
|---|---|---|---|---|
| 4,142,493 A * | 3/1979 | Schira | ................. | F02D 41/0077 123/486 |
| 4,310,801 A * | 1/1982 | Baker | .................... | G01C 22/02 327/294 |
| 4,521,898 A * | 6/1985 | Akram | ................... | H03K 23/58 377/106 |
| 4,726,045 A * | 2/1988 | Caspell | ................ | H03K 23/665 327/276 |
| 4,741,004 A * | 4/1988 | Kane | ..................... | H03K 23/665 377/110 |
| 4,770,842 A * | 9/1988 | Kelly | ...................... | G08C 15/04 376/216 |
| 4,891,827 A * | 1/1990 | Slater | ..................... | H03K 23/58 377/107 |
| 5,029,191 A * | 7/1991 | Robbins | ................. | H03K 21/02 377/110 |
| 5,060,243 A * | 10/1991 | Eckert | .................... | H03K 21/12 377/111 |
| 6,026,140 A * | 2/2000 | Owen | ..................... | H03K 23/58 377/110 |
| 6,396,312 B1 * | 5/2002 | Shepston | ................ | G04F 10/04 327/105 |

(Continued)

*Primary Examiner* — Adam D Houston
(74) *Attorney, Agent, or Firm* — Fenwick & West LLP (57) ABSTRACT

A programmable clock divider having reset circuits configured to receive a DP count comprises a first flip-flop having a clock input, a first output, and one of the DP inputs configured to receive a clock signal, a plurality of flip-flops connected to form a ripple counter configured to each receive a DP input, a clock input, and a reset input to provide a first output coupled to the clock input of a subsequent flip-flop of the plurality of flip-flops, each subsequent flip-flop having its clock input coupled to the first output of the preceding flip-flop, a first reset circuit coupled to the flip-flops configured to provide an out signal in response to the flip-flops obtaining the DP count, and a second reset circuit configured to provide a reset signal to the reset input of the plurality of flip-flops in response to the out signal from the first reset circuit.

19 Claims, 5 Drawing Sheets

(56) References Cited

U.S. PATENT DOCUMENTS

| | | | | |
|---|---|---|---|---|
| 6,466,065 B1* | 10/2002 | Takekawa | ............ | H03K 23/667 |
| | | | | 327/115 |
| 8,644,447 B2* | 2/2014 | Prakash | ............... | H03K 23/588 |
| | | | | 377/107 |
| 8,847,637 B1* | 9/2014 | Guyton | .................. | H03K 23/58 |
| | | | | 327/115 |
| 9,344,093 B2* | 5/2016 | Hsieh | ..................... | H03K 21/40 |
| 2011/0163784 A1* | 7/2011 | Loeda | .................... | H03K 23/68 |
| | | | | 327/117 |
| 2014/0219320 A1* | 8/2014 | Germain | ................. | G01S 19/30 |
| | | | | 375/147 |
| 2015/0188546 A1* | 7/2015 | Goyal | ................. | H03K 23/588 |
| | | | | 377/119 |
| 2015/0222283 A1* | 8/2015 | Wanibuchi | ................ | G06F 1/08 |
| | | | | 327/115 |
| 2016/0172018 A1* | 6/2016 | Nam | .................... | G11C 7/1012 |
| | | | | 365/189.05 |
| 2017/0039309 A1* | 2/2017 | Wang | .................. | G06F 30/394 |
| 2017/0149419 A1* | 5/2017 | Kornilov | ............. | H03K 3/0375 |

* cited by examiner

METHOD AND APPARATUS FOR OPERATING PROGRAMMABLE CLOCK DIVIDER USING RESET PATHS

FIELD OF INVENTION

The disclosure generally relates to programmable clock dividers, and more particularly relates to a programmable clock divider with reset and parallel data loading techniques for speed enhancement.

BACKGROUND

Programmable clock dividers or frequency dividers of various conventional configurations have been used in numerous applications though out the art of digital circuitry. One of the more commonly desired characteristics of digital circuitry is high speed operation. High speed phase-locked loops (PLLs) are considered to be a basic element of digital design and are widely employed in radio, telecommunications, computers and other electronic applications. PLLs can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase-locked-loop building block, the technique is widely used in modern electronic devices, with output frequencies from a fraction of a hertz up to many gigahertz.

In general, a clock divider is basically a counter. Flip-flops are commonly used to keep track of the number of clock pulses applied to the counter. Although other types of flip-flops can be uses, D flip-flops are basic building blocks of sequential logic circuits, and are often used to construct counters. D flip-flops have a D (data) input and a clock (CLK) input and outputs Q and Q_bar. Counters are sequential logic devices that are activated or triggered by an external timing pulse or clock signal. A counter can be constructed to operate as a synchronous circuit or an asynchronous circuit. With synchronous counters, all the data bits change synchronously with the application of a clock signal. Whereas an asynchronous counter is independent of the input clock so the data bits change state at different times one after the other.

Consequently, synchronous counters tend to consume much more power than asynchronous counters. A type of asynchronous counter is a ripple counter. In a ripple counter, only the first flip-flop is clocked by the clock signal. All subsequent flip-flops are clocked by the output of the preceding flip-flop which enables the output clock pulses to ripple through each of the flip-flops. Ripple counters can be used for frequency divider, time measurement, frequency measurement, distance measurement and also for generating square waveforms.

Counters are sequential logic devices that follow a predetermined sequence of counting states that are triggered by an external clock signal. The number of states or counting sequences through which a particular counter advances before returning back to its original starting state is call the modulus (MOD). The modulus is the number of states a counter counts and is the dividing number of the counter. The MOD of a ripple counter or asynchronous counter is 2n if n is the number of flip-flops being used in the counter. For example, a 4-bit counter has four flip flops and a range of counts from binary 0000 to 1111 ($2^4$-1). A ripple counter may count up or count down depending on designer preference. Asynchronous counters like the ripple counter are slower than synchronous counters because of the propagation delay in the transmission of the pulses from flip-flop to flip-flop. However, synchronous counters consume much more power than their asynchronous counterparts.

A challenge with ripple counters occurs when the counter reaches the count limit, the ripple counter has to be reset and loaded with another count value with minimum delays. Accordingly, there is a need for a ripple counter that minimizes delays to reset and initiate a load count for another operation that overcomes delays and disadvantages of current ripple counters.

SUMMARY OF THE INVENTION

A novel programmable clock divider is disclosed which overcomes disadvantages of previous clock dividers. The novel programmable clock divider includes multiple reset circuits to quickly and fully reset the clock divider when a data parallel (DP) count is obtained. Accordingly, the programmable clock divider configured to provide an out signal in response to a clock signal received at a clock input and a DP count having a plurality of DP inputs comprises a first flip-flop having a clock input, a first output, and a first DP input configured to receive the clock signal and one DP input from the plurality of DP inputs, a plurality of flip-flops, each flip-flop having a clock input, a DP input, a first output, and a reset input wherein the clock input of a first plurality of flip-flops is coupled to the first output of the first flip-flop, each subsequent plurality of flip-flops having its clock input coupled to the first output of the preceding flip-flop, a first reset circuit includes an adder coupled to the first outputs of the first flip-flop and each of the plurality of flip-flops to generate the out signal, and a second reset circuit coupled to the first reset circuit and the plurality of flip-flops configured to provide a reset signal to the reset inputs of the plurality of flip-flops in response to the out signal from the first reset circuit.

In accordance to another embodiment of the present invention, the second reset circuit includes a bypass circuit configured to receive the out signal and provide the reset signal to the plurality of flip-flops. The bypass circuit ensures the Rst signal is active for a longer period and provides an asynchronous reset.

In accordance to another embodiment of the present invention, the second reset circuit includes a reset flip-flop configured to receive the out signal and generate the reset signal to the plurality of flip-flops in response to the clock signal. The reset signal is synchronously released by the reset flip flop. A two step reset is advantageous for high speed when a reset is applied to preload a next count once current count is done. The second reset ensures pre-loading of flip-flops does not create glitches that will produce incorrect count. An elongated reset is based on the flip-flop electrical location.

In accordance to yet another embodiment of the present invention, the clock signal is an inverted clock signal. The inverted clock signal extends the period of the reset signal for the clock divider.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein. It is also appreciated that the terms such as "first", "second", "third", etc. are used to distinguish between elements such terms describe. These terms are not necessarily intended to indicate temporal or prioritization of such elements, unless otherwise explicitly stated.

A ripple counter for use as a clock divider can be used in devices that need a frequency divider such as clock feedback divider used in phase-locked loops (PLLs). The disclosed clock divider provides a programmable divider with no limitation in integer division ration due to using a parallel data loading technique in its flip-flops. Multiple reset paths in the clock divider increases the divider speed and accommodates any ripple in the data count. In a ripple counter, it is the first flip flop that is clocked by an external clock. All subsequent flip-flops are clocked by an output of a previous flip-flop, and the operation frequency of the preceding flip-flops is double of the subsequent flip-flops which greatly reduces power consumption compared with synchronous counters when all devices are running at the external clock frequency. Each flip-flop provides a divide by 2 function and each output of the flip-flop is provided to an adder for summing.

Figure 1:
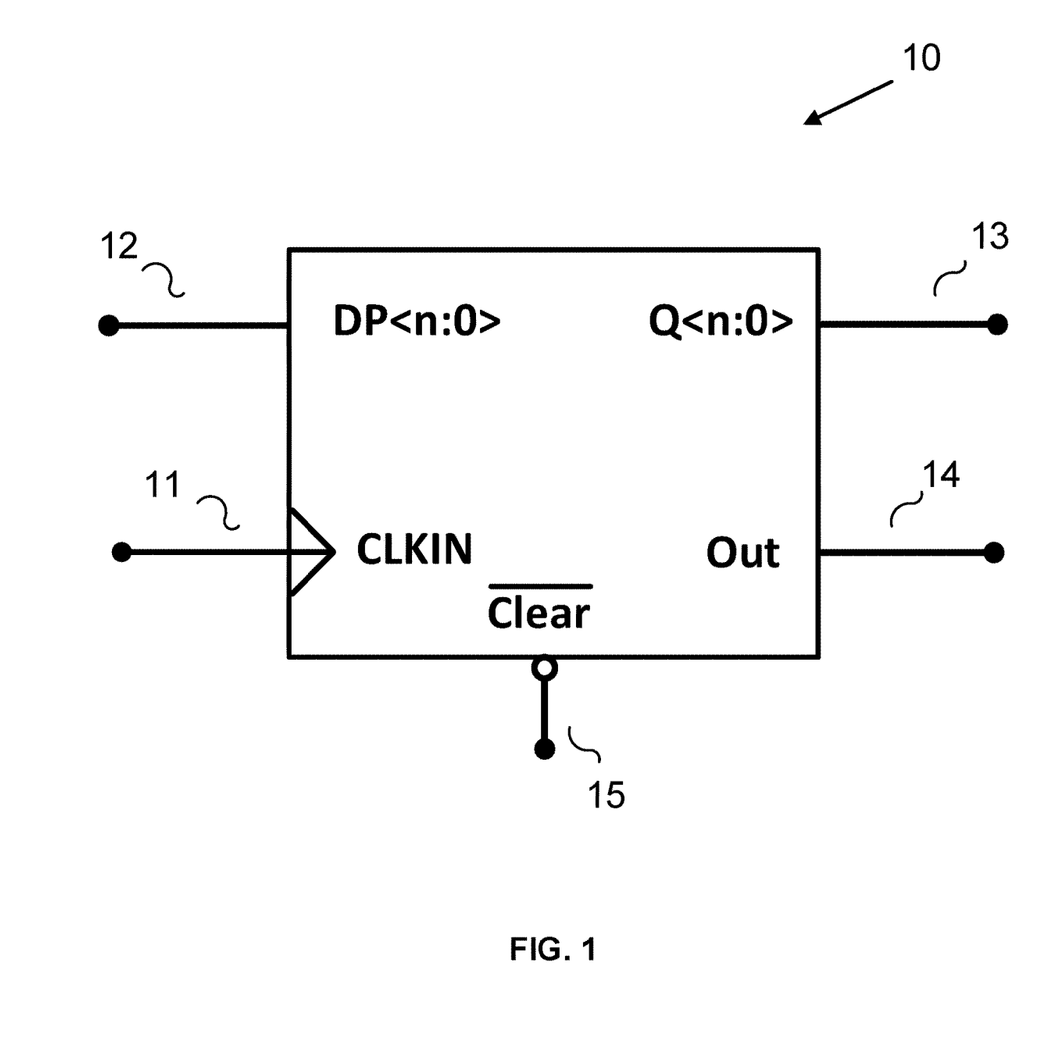
FIG. 1 illustrates a divider package of a programmable divide-by-N counter in accordance to an embodiment of the present invention.

FIG. 1 illustrates a block diagram of a high-speed programmable clock divider 10 of the present invention. The high-speed programmable clock divider has a Clear_bar input 15 configured to reset the high-speed programmable clock divider 10 to an initial configuration, a CLKIN 11 input for receipt of an input clock signal, a data parallel (DP) <n:0> input 12 consisting of a multi-bit binary input representing a programmed number count, a Q<n:0> output 13 consisting of a multi-bit binary output representing a present number count, and an Out output 14 configured to provide an Out signal when a programmed number count has been reached. In operation, a Clear_bar signal (active low) is applied to the high-speed programmable clock divider 10 to reset the counter to an initial state in preparation for a new data count. Next, a DP input consisting of a binary representation of the count is applied to input DP<n:0>, which in the present embodiment is set to six bits corresponding to the number of stages (or flip-flops) applied in the programmable clock divider. Although more stages may be added or removed depending on the application, the current disclosure will be described with respect to six stages. Accordingly, the maximum value of N, the divisor, is sixty-three (e.g. $2^6-1$). Once the value of N has been reached, the programmable clock divider provides an Out signal at output 14 to indicate that the programmed count has be reached.

Figure 2:
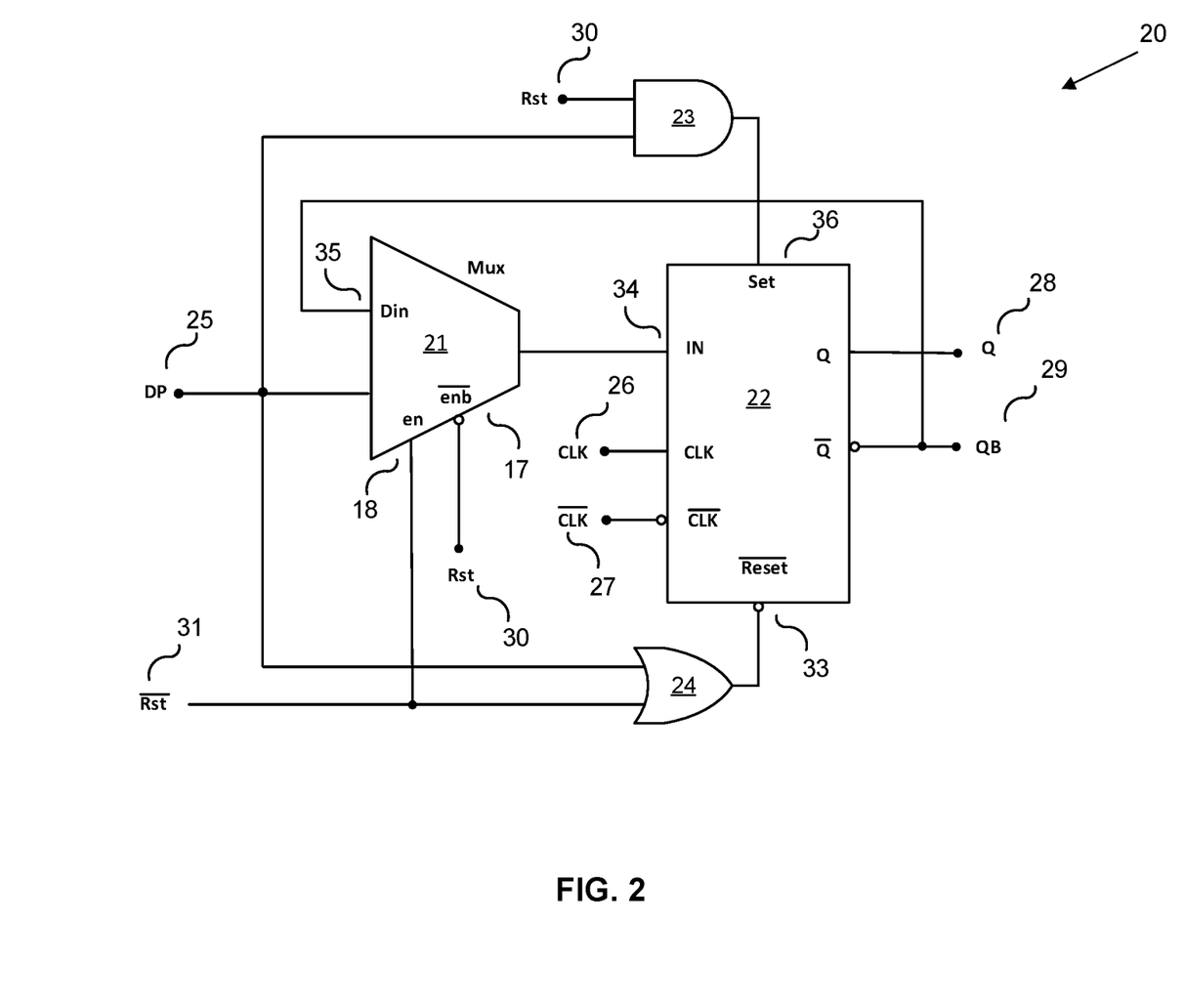
FIG. 2 illustrates a block diagram of a flip-flop of the plurality of flip-flops used for the programmable divide-by-N counter in accordance with the present invention.

As mentioned, the high-speed programmable clock divider in accordance to an embodiment of the present invention includes six stages or 6 flip-flops serially coupled to provide the programmable clock divider. Referring to FIG. 2, a block diagram of a flip-flop assembly 20 of the six plurality of flip-flops used for the programmable clock divider 10 is illustrated in accordance to an embodiment of the present invention. The flip-flop assembly 20 includes a DP input 25 coupled to a first input of an "and" gate 23, a first input of an "or" gate 24, and a first input of a mux 21. A second input of the "and" gate 23 is coupled to a Rst signal 30 with the output of the "and" gate 23 coupled to a Set input 36 of an SR latch 22. The Rst signal 30 is also coupled to an enb_bar input 17 of the mux 21. The SR latch 22 or SR flip-flop is a one-bit memory bistable device that has two control inputs, one which will "SET" the device (meaning the output="1") and is labelled Set, and one which will "RESET_bar" the device (meaning the output="0"), labelled Reset_bar. Accordingly, the SR description stands for "Set-Reset". The reset input resets the flip-flop back to its original state with an output Q that will typically be a logic "0". Rst_bar 31 is coupled to the second input of the "or" gate 24 with the output coupled to Reset_bar 33 of the SR latch 22. The Rst_bar 31 is also coupled to the en (enable) input 18 of the mux 21. The output of mux 21 is coupled to the IN input 34 of the SR latch 22. CLK 26 is coupled to the CLK input of the SR latch 22, and CLK_bar 27 is coupled to the CLK_bar input of the SR latch 22. The SR latch provides outputs Q 28, and QB (i.e. Q_bar) 29 with QB 29 also coupled to Din 35 of mux 21.

Figure 3:
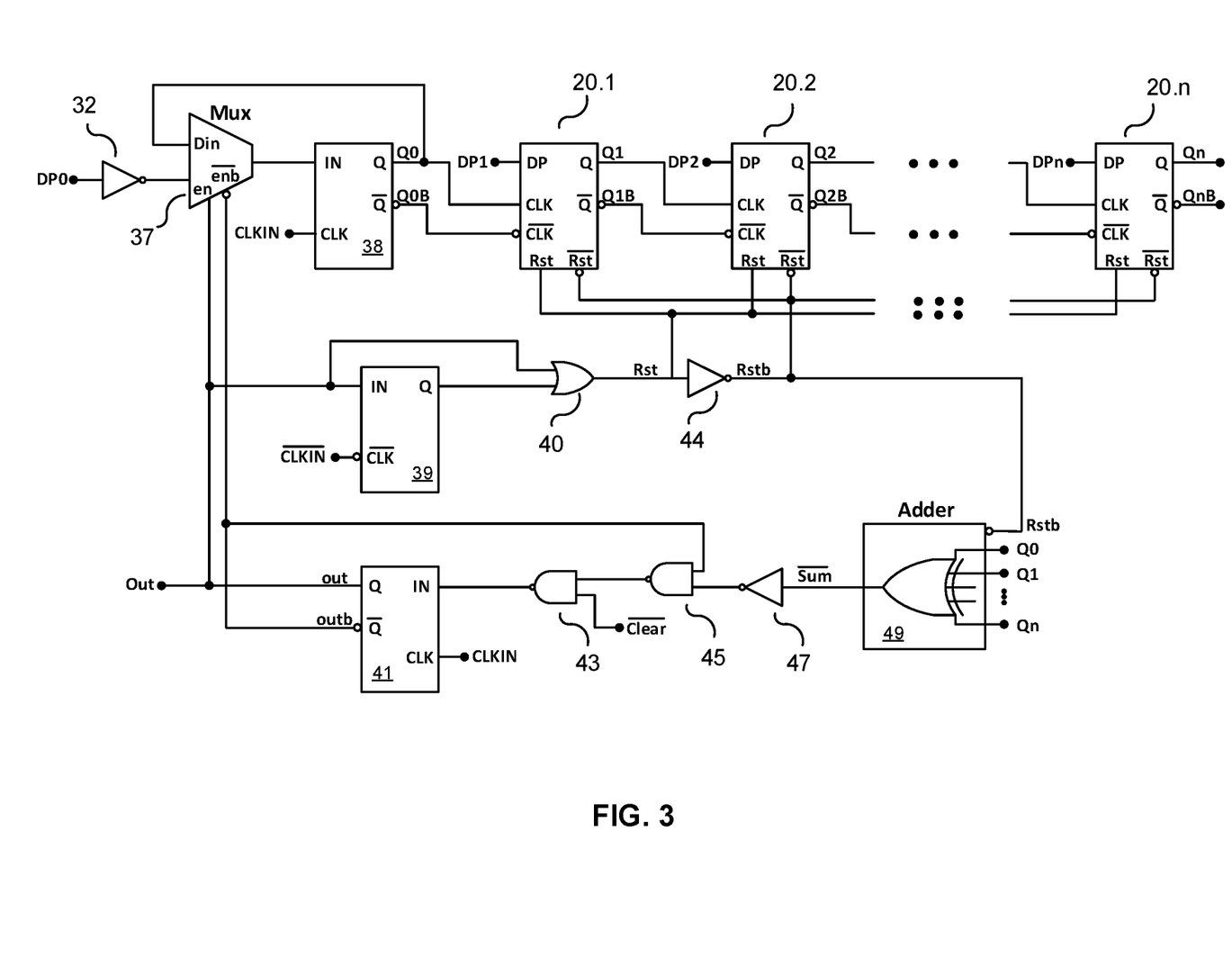
FIG. 3 illustrates a block diagram of the programmable divide-by-N counter in accordance to an embodiment of the present invention.

FIG. 3 illustrates a block diagram of the programmable clock divider 10 in accordance to an embodiment of the present invention. The programmable clock divider includes a plurality of flip-flops 20.1-20.n serially connected as a ripple counter. In accordance to an embodiment of the present invention, the value of N is a six-digit binary number applied to DPO through DPn where n=5 for programming the clock divider. The flip-flops 20.1-20.n are described with respect to the flip-flop assembly 20 of FIG. 2. Input DPO is coupled to inverter 32 which is coupled to a first input of mux 37. The output of mux 37 is coupled to a data input IN of flip-flop 38. Q0 output of flip-flop 38 is coupled to a second input of mux 37 and to a CLK input of flip-flop 20.1. Q0_bar output of flip-flop 38 is coupled to CLK_bar input of SR latch 20.1. Input DP1 is coupled to DP input of SR latch 20.1 with output Q1 coupled to CLK input of SR latch 20.2 and output Q1B coupled to CLK_bar input of SR latch 20.2. Similarly, input DP2 is coupled to DP input of SR latch 20.2 with output Q2 coupled to CLK input of SR latch 20.n and output Q2B coupled to CLK_bar input of SR latch 20.n, where n=5. Accordingly, there are two additional SR latches that are not shown but are similarly coupled so as not to unduly obscure the drawing. Adder 49 is an exclusive "or" coupled to outputs Q0, Q1, Q2, . . . Qn where n=5. In accordance to an embodiment of the present invention, when the clock divider obtains the programmed count, the Q outputs of the SR latches 20.1-20.n and flip-flop 38 are high or logic "1". The adder 49 also includes a Rst_bar input to reset the adder 49. The output of adder 49, Sum_bar (active low), is coupled to an inverter 47 with the output of inverter 47 coupled to a first input of a nand gate 45. The output of the nand gate 45 is coupled to a first input of a nand gate 43. Signal Clear_bar is coupled to a second input of the nand gate 43 with the output of the nand gate 43 coupled to a data input IN of a flip-flop 41. CLK input of the flip-flop 41 is coupled to input clock signal CLKIN. An output Q of flip-flop 41 provides an Out signal for output and an output Q_bar of flip-flop 41 provides an Out_bar signal. The Out signal of flip-flop 41 is coupled to the en input of mux 37, an IN input of flip flop 39, and a first input of an "or" gate 40. The Out_bar signal is coupled to the enb_bar input of mux 37. Initially, en input and enb_bar input of mux 37 are active to select DPO. Afterwards, other input to mux 37 is selected. Flip-flop 39 is configured to toggle on a negative edge of an input clock and receives a CLKIN_bar signal to provide an output Q coupled to a second input of the "or" gate 40. An output of "or" gate 40 provides a Rst signal that is coupled to a Rst input of each of the SR latches 20.1-20.n. The output of "or" gate 40 is also coupled to an inverter 44 which provides an output Rst_bar. The output Rst_bar is coupled to a Rst_bar input of each of the SR latches 20.1-20.n and to the adder 49.

Figure 4:
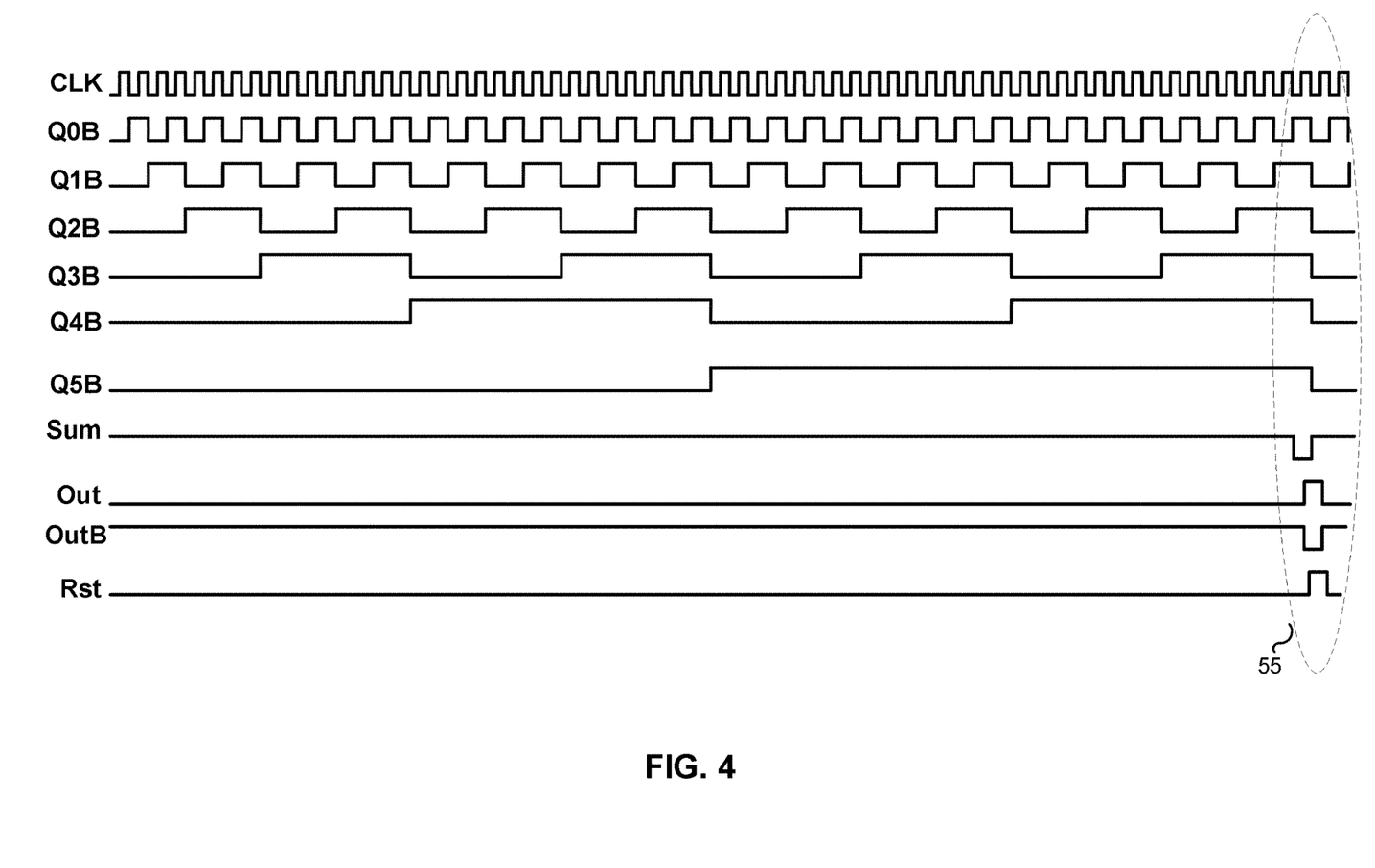
FIG. 4 is a timing diagram indicating various signal levels produced in response to a clock signal input as the programmable divide-by-N progresses through a sequence of counting states.

FIG. 4 is a timing diagram indicating various signal levels produced in response to a clock signal input as the divider of FIG. 1 progresses through a sequence of counting states. The clock signal CLK applied to the counter provides the rectangular waveform appearing at the top of FIG. 5 while the counter is reset to state 0 and up-counts to state 63. Flip-flop 38 is toggled by the clock signal CLKIN and produces a Q0B output shown in FIG. 5. Since flip-flop 38 is in the leading position, it operates or toggles at the highest rate in relation to the succeeding flip-flops in the counting chain.

Below the output of flip-flop 38, a Q1B output is depicted for flip-flop 20.1. Next in the counting chain is flip-flop 20.2 which produces a Q2B output signal. Below the output of flip-flop 20.2, a Q3B output is depicted for flip-flop 20.3. Next in the counting chain is flip-flop 20.4 which produces a Q4B output signal. Below the output of flip-flop 20.4, a Q5B is depicted for flip-flop 20.5. Moving forward to dashed line 55, the output of adder 49 produces a low Sum signal when the divider obtains the maximum value of N, the divisor, which in this case is 63 counts, and it produces a positive Out signal and a negative Out_bar signal that generates a Rst signal for resetting the clock divider 10. Once the clock divider 10 is reset, the clock divider 10 receives the clock signal CLKIN and begins to up-count to 63 as the Q0B output begins to toggle.

FIG. 4 is a timing diagram indicating various signal levels produced in response to a clock signal input as the divider of FIG. 1 progresses through a sequence of counting states. The clock signal CLK applied to the counter provides the rectangular waveform appearing at the top of FIG. 5 while the counter is reset to state 0 and up-counts to state 63. Flip-flop 38 is toggled by the clock signal CLKIN and produces a Q0B output shown in FIG. 5. Since flip-flop 38 is in the leading position, it operates or toggles at the highest rate in relation to the succeeding flip-flops in the counting chain.

Below the output of flip-flop 38, a Q1B output is depicted for flip-flop 20.1. Next in the counting chain is flip-flop 20.2 which produces a Q2B output signal. Below the output of flip-flop 20.2, a Q3B output is depicted for flip-flop 20.3. Next in the counting chain is flip-flop 20.4 which produces a Q4B output signal. Below the output of flip-flop 20.4, a Q5B is depicted for flip-flop 20.5. Moving forward to dashed line 55, the output of adder 49 produces a low Sum signal when the divider obtains the maximum value of N, the divisor, which in this case is 63 counts, and it produces a positive Out signal and a negative Out_bar signal that generates a Rst signal for resetting the clock divider 10. Once the clock divider 10 is reset, the clock divider 10 receives the clock signal CLKIN and begins to up-count to 63 as the Q0B output begins to toggle.

Figure 5:
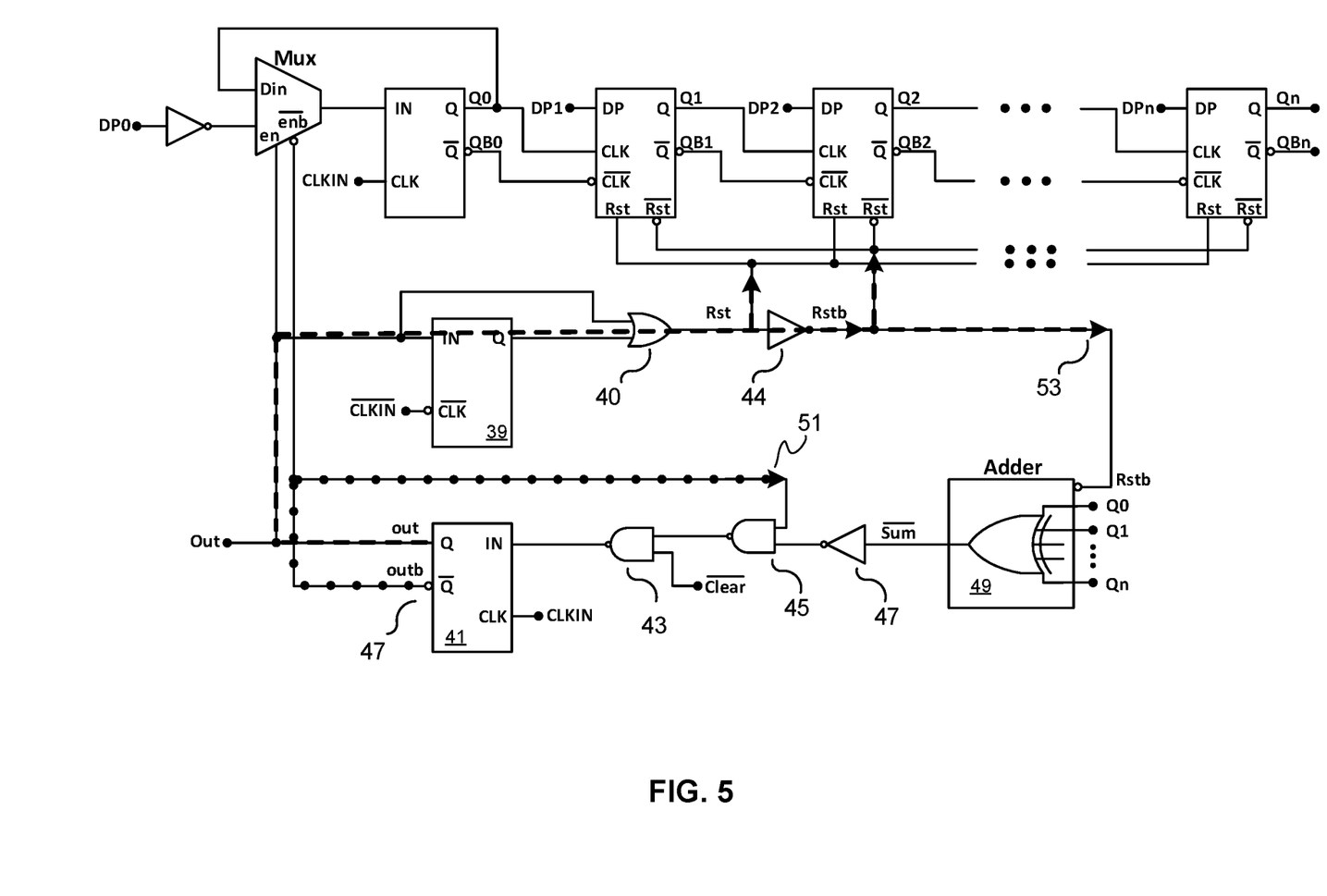
FIG. 5 illustrates a block diagram of an embodiment of the divide-by-N counter highlighting a plurality of reset paths in accordance with the present invention.

FIG. 5 illustrates a block diagram of an embodiment of the clock divider highlighting a plurality of reset paths in accordance with the present invention. A dotted line 51 highlights a first reset data path for resetting a flip flop used to provide the reset signals, Rst and Rst_bar. A dashed line 53 highlights a second reset data path for resetting the SR latches 20.1-20.n used in the divide-by-N counter. With respect to the first reset data path, as the programmable clock divider reaches a programmed count, the Qn outputs of the SR latches will all be "1". As the adder 49 receives the outputs from Q0, and Q1-Qn of the SR latches, the output of adder 49, Sum_bar, which is an exclusive "or" gate will be low or logic "0". The output Sum_bar is applied to inverter 47 which inverts the low or logic "0" and outputs a high or logic "1" that causes the output of nand gate 45 to be low or logic "0", since signal Clear_bar is active low. At the current state, Clear_bar is high or logic "1". The other input to nand gate 43 is low or logic "0" which produces an output high or logic "1". The logic "1" applied to input IN of flip-flop 41 produces a Q high, logic "1". Similarly, the output of flip-flop 41 Q_bar produces an active out_bar low, logic "0". The active out_bar signal is applied to an input of nand gate 45 which changes its previous low or logic "0" output to a high or logic "1". The logic "1" applied to nand gate 43 along with a high signal from Clear_bar produces a low or logic "0" at the IN input of the flip-flop 41. At the next clock cycle, Q out of flip-flop 41 provides a low or logic "0" Out signal which resets the Out signal. However, prior to the Out signal being reset to low or logic "0", the high or logic "1" of the Out signal is applied flip-flop 39 and to a first input of "or" gate 40 with a high or logic "1". The "or" gate 40 provides an asynchronous parallel or bypass path for the Out signal to lengthen the Rst signal without affect to count. A synchronous release of reset is provided by Flip-flop 39. Flip-flop 39 provides a second path that is clocked by CLKIN_bar instead of CLKIN. CLKIN_bar synchronizes the Q output of flip-flop 39 with a negative edge of the CLKIN signal. The Q output of flip-flop 39 synchronizes reset to settle the parallel data during a new load operation. The synchronized reset ensures the parallel data is stable during the new load operation. Output Q of flip-flop 39 is high or logic "1" which is applied to "or" gate 40. Since, gate 40 is an "or" gate, a high signal or logic "1" to an "or" gate input will still produce a high or logic "1" for the Rst signal that is applied to the SR latches 20.1-20.n. Inverter 44 receives the active Rst signal and inverts the signal to provide an active Rst_bar. The active Rst_bar signal is applied to Rst_bar input of each of the plurality of SR latches 20.1-20.n and to the Adder 49. The novel approach of utilizing multiple reset paths and synchronizing the divider with CLKIN removes data counting ripple and increases the speed of the divider. A first reset path is applied sooner to preload the counter once a count is reached. A second reset loop ensures that pre-loading flip-flops do not create a large glitch that causes an incorrect count. The two reset paths provide one elongated reset based on the flip-flop electrical location.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A programmable clock divider configured to provide an out signal in response to a clock signal received at a clock input and a multi-bit programmed number, comprising:
    a counter comprising:
        a first flip-flop having a clock input configured to receive the clock signal, a data input configured to receive a first bit of the multi-bit programmed number, and a first output
        a second flip-flop having a clock input configured to receive the first output from the first flip-flop, and a data input configured to receive a second bit of the multi-bit programmed number and a reset input;
    a first reset circuit configured to generate the out signal based on a count of the counter; and
    a second reset circuit coupled to the first reset circuit, the second reset circuit configured to provide a reset signal to the reset inputs of the plurality of flip-flops in response to the out signal from the first reset circuit.

2. The programmable clock divider of claim 1, wherein the second reset circuit includes a bypass circuit configured to receive the out signal and provide the reset signal to the second flip-flop of the counter.

3. The programmable clock divider of claim 2, wherein the second reset circuit includes a reset flip-flop configured to store the out signal in response to the clock signal, wherein the second reset circuit is configured to generate the reset signal based on an output of the reset flip-flop.

4. The programmable clock divider of claim 3, wherein the clock signal is an inverted clock signal.

5. The programmable clock divider of claim 3, wherein the bypass circuit and the reset flip-flop of the second reset circuit include parallel reset paths.

6. The programmable clock divider of claim 1, wherein the first reset circuit comprises:
    an adder configured to receive the count of the counter and generate an output having a preset value when the count of the counter reaches a predetermined value; and
    a first reset circuit flip-flop configured to receive the output from the adder to generate the out signal.

7. The programmable clock divider of claim 6, wherein the first reset circuit further comprises an "and" gate configured to receive an inverted output from the adder and an inverted output from the first reset flip-flop to generate an input signal of the first reset flip-flop.

8. The programmable clock divider of claim 6, wherein the reset signal further resets the adder and the out signal.

9. The programmable clock divider of claim 1, wherein the first flip-flop includes a second output coupled to an inverse clock input of the second flip-flop.

10. A programmable clock divider configured to provide an out signal in response to a clock signal, comprising:
    a first flip-flop having a clock input configured to receive the clock signal, and a data input configured to receive a first bit of the multi-bit programmed number;
    a second flip-flop serially connected to the first flip-flop to form a ripple counter, wherein the second flip-flop has a clock input configured to receive a first output signal from the first flip-flop, a second output, and a reset input;
    a first reset circuit configured to generate the out signal in response to the first flip-flop and the second flip-flop reaching a predetermined count; and
    a second reset circuit coupled to the first reset circuit, the second reset circuit configured to provide a reset signal to the reset inputs of the plurality of flip-flops in response to the out signal from the first reset circuit.

11. The programmable clock divider of claim 10, wherein the first reset circuit includes:
    an adder coupled to the first output of the first flip-flop and the second output of the second flip-flop to generate a sum signal; and
    a first reset flip-flop coupled to the adder and configured to receive the sum signal and provide the out signal.

12. The programmable clock divider of claim 10, wherein the second reset circuit includes a second reset flip-flop configured to receive the out signal and the clock signal and to provide the reset signal to the second flip-flop in response to a negative edge of the clock signal.

13. The programmable clock divider of claim 12, wherein the second reset circuit includes a bypass path comprising an "or" gate configured to receive the out signal as a first input.

14. The programmable clock divider of claim 13, wherein an output of the second reset flip-flop is coupled to a second input of the "or" gate.

15. A method for operating a clock divider, comprising:
    loading a programmed number to a counter of the clock divider;
    increasing a count of the counter in response to receiving a plurality of pulses of a clock signal;
    providing an output signal based on receiving, by a first reset circuit from the counter, the count having a predefined value; and
    providing a reset signal to the reset input of the counter based on receiving, by a second reset circuit coupled to the first reset circuit, the out signal, wherein the reset circuit causes the counter to reload the programmed number.

16. The method of claim 15,
    wherein providing the reset signal to the reset input of the counter comprises:
        storing the out signal in a second reset flip-flop in response to receiving a negative edge of the clock signal.

17. The method of claim 16, wherein providing the reset signal to the reset input of the counter comprises:
    combining the out signal and an output of the second reset flip-flop to generate the reset signal.

18. The method of operating a clock divider of claim 17, wherein combining the out signal and the output of the second reset flip-flop comprises or-ing the out signal and the output of the second reset flip-flop.

19. The method of claim 15, wherein providing the out signal comprises:
    generating a sum signal based on the count of the counter; and
    storing the generated sum signal in a first reset flip-flop in response to receiving the clock signal.

* * * * *